(12) United States Patent
Deng

(10) Patent No.: US 9,406,555 B2
(45) Date of Patent: Aug. 2, 2016

(54) SEMICONDUCTOR DEVICE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Hao Deng, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/718,335

(22) Filed: May 21, 2015

(65) Prior Publication Data
US 2015/0348835 A1 Dec. 3, 2015

(30) Foreign Application Priority Data

May 27, 2014 (CN) .......................... 2014 1 0229127

(51) Int. Cl.
*H01L 21/768* (2006.01)
*H01L 23/532* (2006.01)

(52) U.S. Cl.
CPC .... *H01L 21/76849* (2013.01); *H01L 21/76864* (2013.01); *H01L 21/76879* (2013.01); *H01L 23/53238* (2013.01)

(58) Field of Classification Search
None
See application file for complete search history.

(56) References Cited

U.S. PATENT DOCUMENTS

| | | | |
|---|---|---|---|
| 7,718,548 B2 | 5/2010 | Lee et al. | |
| 2005/0014360 A1* | 1/2005 | Yu | H01L 21/76867 438/622 |
| 2010/0314768 A1* | 12/2010 | Darnon | H01L 21/4846 257/762 |

* cited by examiner

*Primary Examiner* — Angel Roman
(74) *Attorney, Agent, or Firm* — Anova Law Group, PLLC

(57) ABSTRACT

A method for forming an interconnect device is provided by the present disclosure. The method includes providing a dielectric layer on a substrate, forming openings in the dielectric layer to expose a portion of a surface of the substrate at a bottom of each opening and forming a metal layer to fill up the openings. The method also includes forming a semiconductor cover layer on the metal layer and on the dielectric layer, and performing a thermal annealing reaction to convert portions of the semiconductor cover layer that are on the metal layer into a metal capping layer. The method further includes performing a nitridation process on the metal capping layer and a remaining semiconductor cover layer to convert the metal capping layer into a metal nitride capping layer and the remaining semiconductor cover layer into a semiconductor nitride layer.

17 Claims, 5 Drawing Sheets

SEMICONDUCTOR DEVICE AND FABRICATION METHOD THEREOF

CROSS-REFERENCES TO RELATED APPLICATIONS

This application claims the priority of Chinese Patent Application No. 201410229127.0 filed on May 27, 2014, the entire content of which is incorporated herein by reference.

FIELD OF THE DISCLOSURE

The present disclosure generally relates to the field of semiconductor technology, more particularly, relates to a semiconductor device and fabrication method thereof.

BACKGROUND

As very large-scale integrate (VLSI) circuits advance, dimensions of semiconductor devices have been shrinking, and performances of semiconductor devices have been improved accordingly. Due to dimension shrinking of the semiconductor devices, dimensions of interconnects may have to be decreased and consequently may have to carry higher electric current. On the other hand, interconnects are required to have short response time. As a result, conventional interconnect devices are not able to meet the demands on performance of semiconductor devices.

Compared to aluminum (Al), copper has lower resistivity and better resistance to electromigration. Using copper interconnects, resistive-capacitive (RC) delay of interconnects can be reduced. Copper interconnects can also improve electromigration and device reliability of the semiconductor devices. Therefore, copper interconnects are replacing conventional Al interconnects in the semiconductor industry.

However, copper interconnects also have deficiencies. Metallic copper has a high electromigration rate, so copper can diffuse fast in Si, $SiO_2$ and most dielectric materials. Once copper atoms diffuse into semiconductor substrate or dielectric layers, lifetime of minority carriers can be adversely affected and junction leakage current can increase. As a result, circuit failure may occur and reliability of the semiconductor device can be adversely affected.

To solve the problems caused by copper diffusion, a capping layer is often formed on the surface of a metallic layer to prevent copper from diffusing upward into the dielectric layer. Although the capping layer can reduce copper diffusion to a certain extent, performance and reliability of conventional interconnects still need to be improved.

BRIEF SUMMARY OF THE DISCLOSURE

One aspect of the present disclosure provides a method for forming an interconnect device. The method for includes forming an interconnect device. The method includes providing a dielectric layer on a substrate, forming openings in the dielectric layer to expose a portion of a surface of the substrate at a bottom of each opening, and forming a metal layer to fill up the openings. The method also includes forming a semiconductor cover layer on the metal layer and on the dielectric layer, and performing a thermal annealing reaction on the semiconductor cover layer to convert portions of the semiconductor cover layer that are on the metal layer into a metal capping layer. The method further includes performing a nitridation process on the metal capping layer and a remaining semiconductor cover layer to convert the metal capping layer into a metal nitride capping layer and the remaining semiconductor cover layer into a semiconductor nitride layer.

Another aspect of the present disclosure provides an interconnect device. The interconnect device includes a substrate, a dielectric layer on the substrate, and a metal layer passing through the dielectric layer and on the substrate. The interconnect device also includes a metal nitride capping layer on the metal layer, wherein the metal nitride capping layer is formed from underlying portions of the metal layer by a thermal annealing reaction and a nitridation process and a semiconductor nitride layer on the dielectric layer and in direct contact with the metal nitride capping layer. The semiconductor nitride layer and the metal nitride capping layer are from a same semiconductor cover layer after the thermal annealing reaction and the nitridation process.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
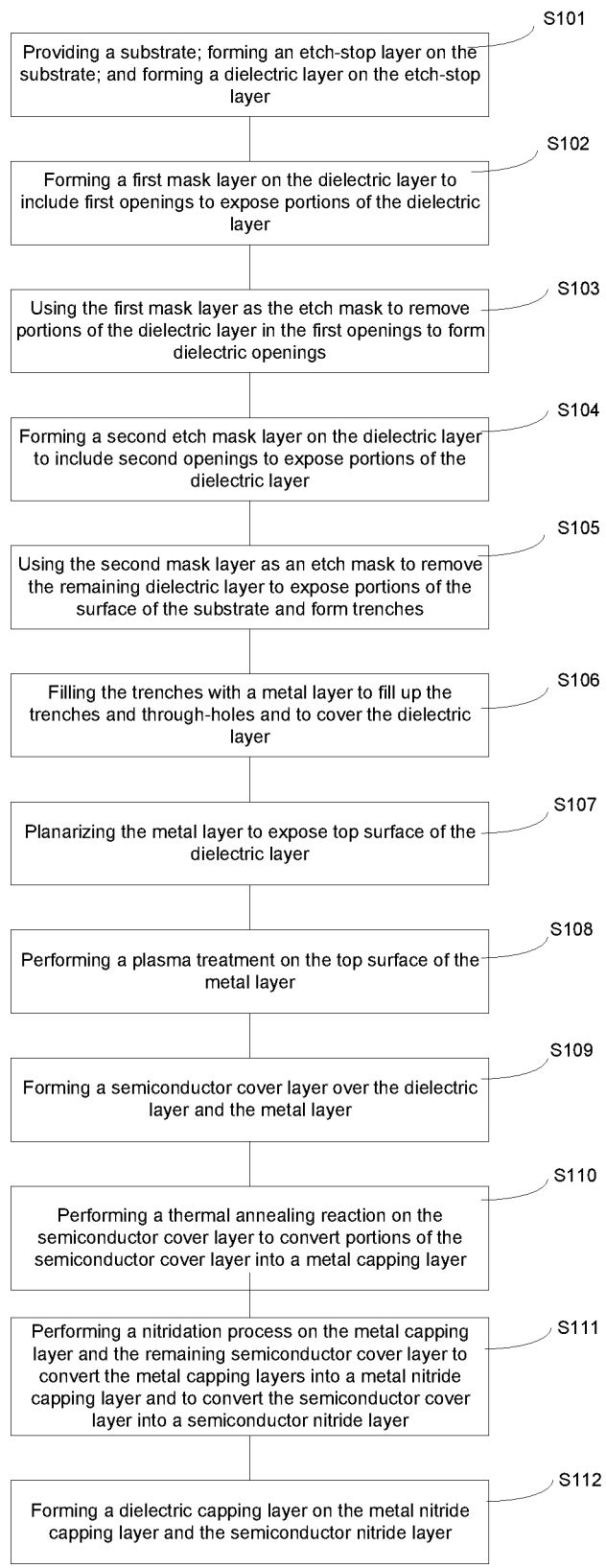
FIG. 1 is an exemplary fabrication process for forming the interconnect device consistent with the disclosed embodiments.

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

The disclosed method is directed to prevent, for example, copper diffusion in interconnect device and apex corner regions of the metal layer, in order to improve the resistance to electromigration in the interconnect device and improve the electrical properties of the resultant interconnect device.

Conventional interconnects may have degraded performance. As integration degree of chips increases, interconnects may have an increased current density when the semiconductor devices are turned on. At the increased current density, metal ions in metal interconnects can move in a direction opposite to the electrons. This is known as electromigration (EM). Electromigration can cause mass pileup of metal ions in localized areas to form metal hillocks. Mass loss in some areas may cause voids. The voids can result in degraded performance of conventional interconnects and even performance failure in conventional interconnects. Further, interconnects are often made of copper because copper diffuses fast in Si and Si compounds. Diffusion of copper atoms is a main reason for an undesirable, enhanced electromigration phenomenon.

Interconnect devices may have increased/improved resistance to the electromigration by preventing copper diffusion from the metal layer of interconnect device. Thus, in a method for forming an interconnect device, the following steps are included.

In step 1, a substrate is provided and a dielectric layer is formed on the substrate.

In step 2, the dielectric layer is etched to form openings and to expose a portion of the substrate surface at the bottom of each opening.

In step 3, a metal layer is formed to fill up the openings.

In step 4, the surface of the metal layer is pre-treated with silane gas to form a first metal capping layer.

In step 5, a nitridation process is performed on the first metal layer to convert the first metal capping layer to a second metal capping layer.

In step 6, a dielectric capping layer is formed over the surface of the dielectric layer and the surface of the second metal capping layer.

Although this method can reduce copper diffusion to some extent and alleviate/improve the problems caused by electromigration in the interconnect device, the resistance to electromigration of the resultant interconnect devices still need to be significantly improved. For example, as the second metal capping layer is formed on the metal layer, the surface of the metal layer and the second metal capping layer are in contact closely. The copper on the top surface of the metal layer can have a suppressed ability to diffuse upward. However, after the formation of the second metal capping layer, the dielectric capping layer is formed on the surfaces of the second metal capping layer and the dielectric layer. Due to fabrication limitations, voids can be formed between the dielectric capping layer and the second metal capping layer. Copper atoms in the apex corner regions of the metal layer can diffuse into undesired regions through the voids.

An apex corner region of the metal layer can refer to a region of the metal layer near an interface between the dielectric capping layer and the second metal capping layer. An apex corner region can also refer to a region on the top surface of the metal layer, where the metal layer is in contact with the dielectric layer.

The diffusion of the copper atoms into undesired regions can be effectively prevented/reduced by eliminating the voids between the second metal capping layer and the dielectric capping layer. In this case, if the second metal capping layer and the dielectric capping layer are in direct contact, diffusion of the copper atoms on the top surface of the metal layer can be prevented/reduced. Copper diffusion into undesired regions, caused by copper atoms in the apex corner regions of the metal layer, can be effectively prevented/reduced. Accordingly, the interconnect device can have enhanced resistance to electromigration and the electrical properties of the interconnect device can be improved.

The present disclosure provides an interconnect device and a fabrication method for forming an interconnect device. In an exemplary method, openings are first formed in a dielectric layer to expose a portion of a substrate surface at the bottom of each opening. The openings are filled with a metal layer. A semiconductor cover layer is formed on the metal layer and the dielectric layer. A thermal annealing reaction/process is performed on the semiconductor cover layer to convert the portion of the semiconductor cover layer on the metal layer into a metal capping layer.

Because the semiconductor cover layer is formed on the metal layer and the dielectric layer, no voids can be formed in the semiconductor cover layer on the apex corner regions of the metal layer. After the semiconductor cover layer on the metal layer has been converted into the metal capping layer, no voids can be formed in an interface between the metal capping layer and the adjacent semiconductor cover layer. Thus, the metal capping layer and the remaining semiconductor cover layer can provide a desirable barrier to prevent metal atoms (e.g., copper atoms) in the apex corner regions of the metal layer from diffusing into undesired regions. The interconnect device thus can have improved resistance to electromigration.

FIG. 1 illustrates an exemplary fabrication process for forming an interconnect device. FIGS. 2-13 are cross-section views of interconnect device corresponding to various stages during the exemplary fabrication process.

Figure 2:
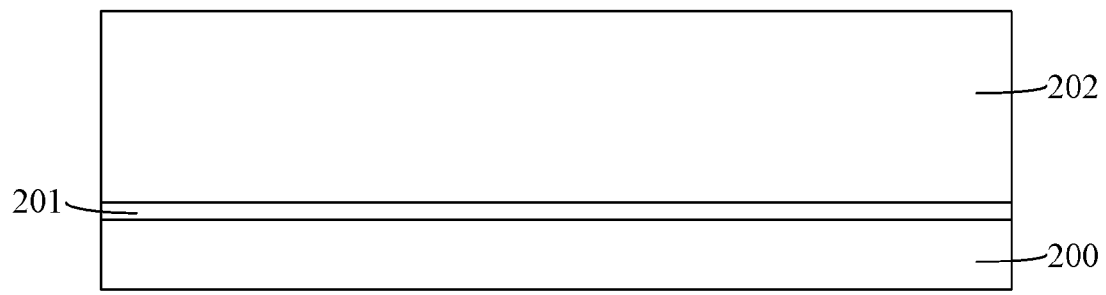
FIGS. 2-13 illustrate cross-section views of an interconnect device corresponding to certain stages of an exemplary fabrication process consistent with various disclosed embodiments.

As shown in FIG. 1, at the beginning of the process, a substrate is provided. An etch-stop layer is formed on the substrate. A dielectric layer is formed on the etch-stop layer (S101). FIG. 2 illustrates a corresponding cross-section view of the interconnect device.

As shown in FIG. 2, a substrate 200 can be provided. An etch-stop layer 201 can be formed on the substrate 200.

The substrate 200 can be made of crystalline silicon, poly silicon, and/or amorphous silicon. The substrate 200 can also be made of silicon germanium compound or SOI (silicon on insulator). The substrate 200 can also be made of Ge, SiGe, and/or GaAs.

Semiconductor components, such as MOS transistors, can be formed in the substrate 200. A metal wiring layer (not shown) can also be formed in the substrate 200. The metal wiring layer can be used for connecting with the subsequently-formed metal layer. The metal wiring layer can also provide electrical connection between the subsequently-formed metal layer and external environment/other metal layers. In one embodiment, the substrate 200 can be made of Si.

In a subsequent etch process for forming the openings, the etch rate of the etch-stop layer 201 is much lower than the etch rate of a carbon-containing dielectric layer to prevent the substrate 200 from being overly etched. The etch-stop layer 201 can also protect the semiconductor components in the substrate 200. The etch-stop layer 201 can be made of one or more of $Si_3N_4$, carbon-doped $Si_3N_4$, and carbon-doped silicon oxynitride.

As also shown in FIG. 2, the dielectric layer 202 can be formed on the etch-stop layer 201.

The dielectric layer 202 can be made of $SiO_2$, a low k dielectric material (e.g., having a relative dielectric constant greater than or equal to 2.5 and less than 3.9), and/or an ultra-low k dielectric material (e.g., having a relative dielectric constant of less than 2.5). By forming the dielectric layer 202 with a low k dielectric material or an ultra-low k dielectric material, RC delay of the resultant interconnect device can be effectively reduced.

The low k dielectric material or the ultra-low k dielectric material can often be a porous material containing organic methyl groups. For example, the low k dielectric material or the ultra-low k dielectric material can be fluorine-doped glass or carbon-doped glass. The ultra-low material can also be porous SiCOH.

In one embodiment, the dielectric layer 202 can be made of $SiO_2$, and the thickness of the dielectric layer 202 can be about 1000 Å to about 8000 Å.

A plurality of openings can be subsequently formed in the dielectric layer 202 and the etch-stop layer 201. The openings can be single Damascus openings or dual Damascus openings. A dual Damascus opening can be formed from a trench and a through-hole at the bottom of the trench. To form a dual Damascus opening, the trench can be formed before the formation of the through-hole. Alternatively, the trench can be formed after the formation of the through-hole.

For illustration purposes, the present disclosure is described using dual Damascus openings as an example, where dual Damascus openings can be formed by forming through-holes before forming the corresponding trenches. However, it would be appreciated that, trenches can be formed before forming the through-holes at the bottom of the trench to form the exemplary dual Damascus openings in the dielectric layer.

Figure 3:
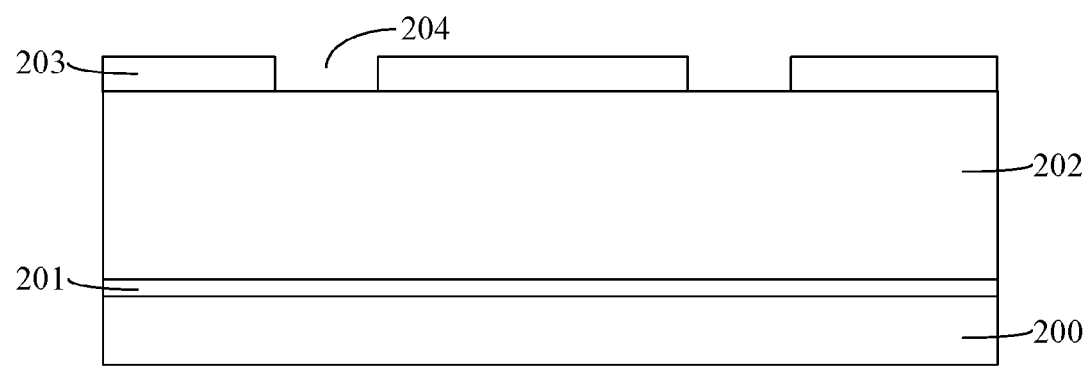

Returning to FIG. 1, after providing the substrate and forming the etch-stop layer and the dielectric layer, a first mask layer is formed on the dielectric layer. The first mask layer has first openings to expose portions of the dielectric layer (S102). FIG. 3 illustrates a corresponding cross-section view of the interconnect device.

As shown in FIG. 3, the first mask layer 203 can be formed on the dielectric layer 202. The first mask layer 203 has first openings 204 to expose portions of the dielectric layer 202. The width of a first opening may equal the width of a subsequently-formed through-hole.

The first mask layer 203 can be made of $SiO_2$, $Si_3N_4$, photoresist, and/or metal. For example, the metal can be TiN, TaN, and/or WN.

In one embodiment, the first mask layer 203 is made of $Si_3N_4$. To form this exemplary first mask layer 203, an initial mask layer can be formed over the dielectric layer 202. A patterned photoresist layer can be formed on the initial mask layer to have patterns corresponding to the first openings. The patterned photoresist layer can be used as an etch mask to etch the initial mask layer and to form the first mask layer 203 with the first openings 204. The bottom of each first opening 204 can expose a portion of the surface of the dielectric layer 202.

Figure 4:
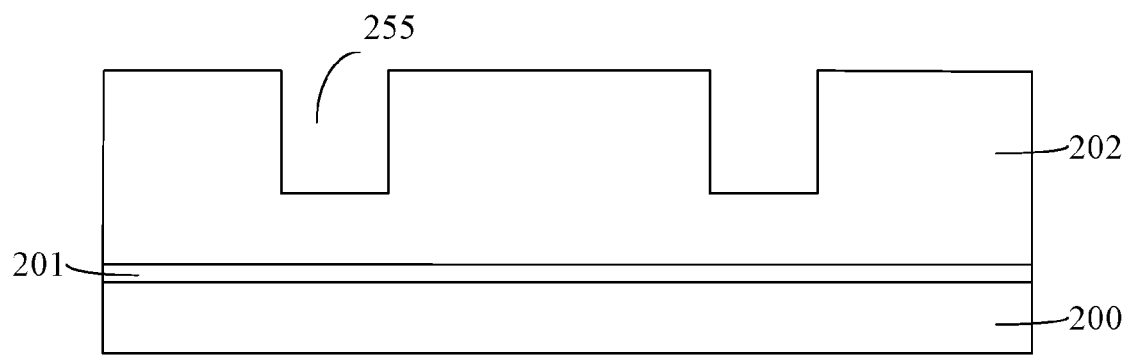

Returning to FIG. 1, after forming the first mask layer on the dielectric layer to expose portions of the dielectric layer, a portion of the dielectric layer is removed from each first opening to form a dielectric opening by using the first mask layer as the etch mask (S103). FIG. 4 illustrates a corresponding cross-section view of the interconnect device.

As shown in FIG. 4, the first mask layer 203 (shown in FIG. 3) can be used as the etch mask to remove a portion of the dielectric layer 202 from each first opening 204 to form dielectric openings 255.

In one embodiment, a dry etch process can be used to remove the portion of the dielectric layer 202 from each first opening 204.

The fabrication process after the formation of the dielectric openings 255 may further include removing the first mask layer 203.

Figure 5:
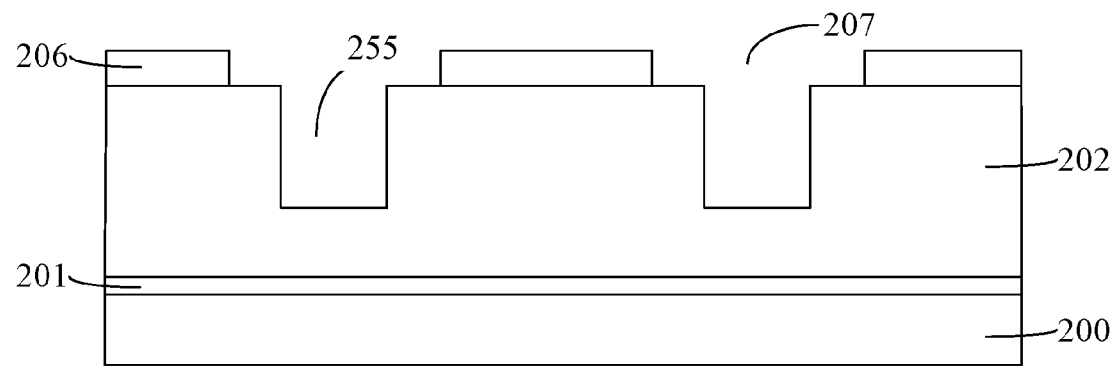

Returning to FIG. 1, after using the first mask layer as the etch mask to remove a portion of the dielectric layer from each first opening to form dielectric openings, a second mask layer is formed on the dielectric layer (S104). The second mask includes second openings to expose portions of the dielectric layer. FIG. 5 illustrates a corresponding cross-section view of the interconnect device.

As shown in FIG. 5, a second mask layer 206 can be formed on the dielectric layer 202. The second mask layer 206 may include second openings 207 to expose a portion of the dielectric layer 202 in each second opening 207. The top width of a second opening 207 may be equal to the width of a subsequently-formed trench.

In one embodiment, the material and process to form the second mask layer 206 can be the same or similar to the material and process to form the first mask layer 203.

Figure 6:
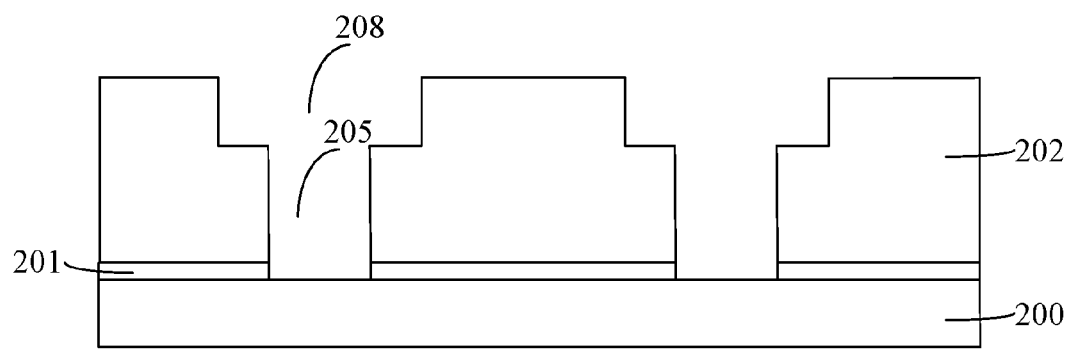

Returning to FIG. 1, after the second mask layer is formed on the dielectric layer, the second mask layer is used as an etch mask to remove the remaining dielectric layer to expose portions of the surface of the substrate and form trenches (S105). FIG. 6 illustrates a corresponding cross-section view of the interconnect device.

As shown in FIG. 6, the second mask layer 206 (shown in FIG. 5) can be used as the etch mask to etch via the second opening 207 (shown in FIG. 5) to remove a second portion of the remaining dielectric layer 202 along the sidewall of each dielectric opening 255 and also to remove exposed portions of the etch stop layer 201 until the surface of the substrate 200 is exposed. Trenches 208 and through-holes 205 can thus be formed. The through-hole 205 is formed at the bottom of a corresponding trench 208 and exposes a surface portion of the substrate 200.

Each through-hole 205 and the corresponding trench 208 can form a dual Damascus opening. The depth and width of the through-hole 205 can be adjusted according to fabrication requirements. The depth and width of the trench 208 can also be adjusted according to fabrication requirements.

In one embodiment, the through-holes 205 can be formed before the formation of the trenches 208 to form the dual Damascus openings to expose the substrate 200. In another embodiment, the trenches 208 can be formed before the formation of the through-holes 205 to form the dual Damascus openings.

Figure 7:
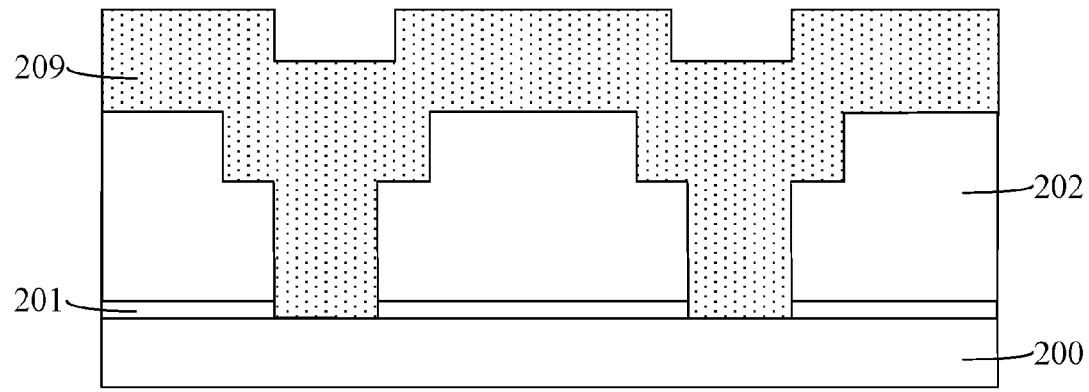

Returning to FIG. 1, after using the second mask layer as the etch mask to remove the second portion of the dielectric layer to expose the surface of the substrate and to form trenches, a metal layer is formed in the trenches and the through-holes to fill up the trenches and the through-holes. The metal layer can be formed to further cover the dielectric layer (S106). FIG. 7 illustrates a corresponding cross-section view of the interconnect device.

As shown in FIG. 7, a metal layer 209 can be formed in the trenches 208 and the through-holes 205 to fill up the trenches 208 and the through-holes 205, and to further cover the dielectric layer 202.

The metal layer 209 can be a single-layered structure or a multiple-layered structure. When the metal layer 209 is a single-layered structure, the metal layer 209 may be a metal bulk layer filling up the dual Damascus openings (including trenches 208 and the through-holes 205) and covering a surface of the dielectric layer 202.

When the metal layer 209 is a multiple-layered structure, the metal layer 209 may include a barrier layer, a metal seed layer, and a metal bulk layer. The barrier layer may cover the bottom and the sidewall of each dual Damascus opening. The barrier layer may also cover the dielectric layer 202. The seed layer may be formed to cover the barrier layer. The metal bulk layer may be formed on the seed layer.

The barrier layer can be made of one or more of Ti, Ta, W, TiN, TaN, TiSiN, TaSiN, WN, and/or WC. The barrier layer can be a single-layered structure or a multiple-layered structure. The barrier layer can be formed by using a chemical vapor deposition, a physical vapor deposition, and/or an atomic layer deposition.

The metal seed layer can be a single-layered structure. The metal seed layer can also be a multiple-layered structure made of metal seeds of varying crystal grain sizes. When the metal seed layer is a multiple-layered structure, metal seeds with smaller crystal grain sizes can be formed under seeds with larger crystal grain sizes to improve the adhesion between the seed layer and the barrier layer.

In one embodiment, the metal bulk layer can be made of Cu. The metal bulk layer can be formed by using a physical vapor deposition and/or an electroplating process.

The barrier layer can prevent the copper atoms in the metal seed layer and the metal layer from diffusing into the substrate 200 or dielectric layer 202 to cause contamination. The barrier layer can also provide desirable interfacial condition for the seed layer, such that the formed seed layer and barrier layer may have sufficiently high adhesion with the dielectric layer and the substrate. The performance of the subsequently-formed interconnect device can be improved.

In one embodiment, the seed layer can be used as the cathode in the electroplating process for forming the subsequent metal layer. The seed layer can also provide desirable interfacial condition for the subsequently-formed metal layer to ensure the metal layer can be formed to have strong adhesion to the metal seed layer. Thus, the subsequently-formed interconnect device can have improved resistance to electromigration.

The metal seed layer can be formed by using a physical vapor deposition process and/or a chemical vapor deposition process.

In one embodiment that a single-layered metal layer 209 is used, the metal layer 209 can be made of Cu by electroplating. In this case, the substrate 200 can be transferred to an electrolytic cell, and the metal layer 209 can be formed in the dual Damascus openings by an electroplating process. In the electroplating process, Cu may fill up the dual Damascus openings, and some Cu may overflow from the dual Damascus openings to the surface of the dielectric layer 202 to form bulk copper on the surface of the dielectric layer 202.

The electrolytic cell may include the electrolyte, a copper anode, a positive electrode, and a negative electrode. The electrolyte may include, for example, copper sulfate, sulfuric acid, and water. The electrolyte may also include a plurality of additives such as catalysts, inhibitors, and/or modifiers.

Figure 8:
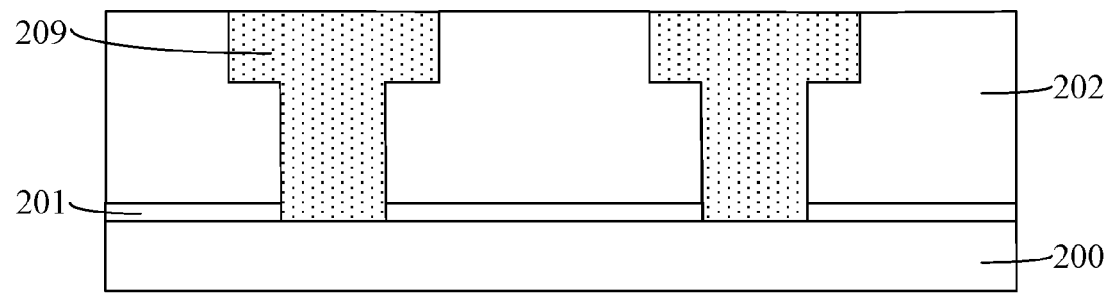

Returning to FIG. 1, after filling the trenches and the through-holes with the metal layer, the metal layer is planarized to expose the top surface of the dielectric layer (S107). FIG. 8 illustrates a corresponding cross-section view of the interconnect device.

As shown in FIG. 8, the metal layer 209 can be planarized to expose the top surface of the dielectric layer 202. The top surface of the metal layer 209 and top surface of the dielectric layer 202 can be coplanar with each other.

In one embodiment, a chemical mechanical polishing (CMP) process can be used to planarize the metal layer 209 to expose the top surface of the dielectric layer 202.

Figure 9:
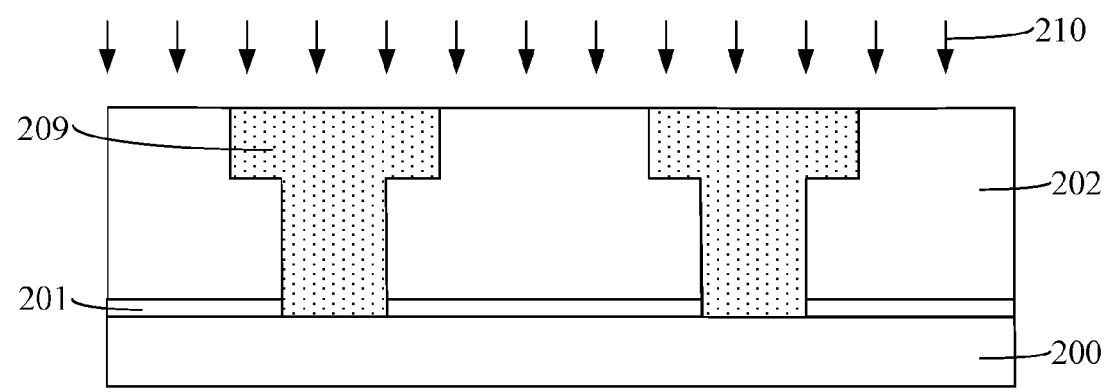

Returning to FIG. 1, after the metal layer is planarized to expose the top surface of the dielectric layer, a plasma treatment is performed on the top surface of the metal layer to treat the top surface of the metal layer (S108). FIG. 9 illustrates a corresponding cross-section view of the interconnect device.

As shown in FIG. 9, a plasma treatment 210 may be performed at least on the top surface of the metal layer 209.

The plasma treatment 210 can be performed to reduce oxidized metal such as oxidized Cu (e.g., CuO). For example, since the metal layer 209 can be exposed to oxygen and moisture in the surrounding environment, oxygen and moisture may oxidize the metal layer 209. The oxidized Cu may provide the interconnect device with degraded conductivity, and to provide poor adhesion to the subsequently-formed metal capping layer. Therefore, the plasma treatment 210 can be performed after the CMP process to reduce oxidized Cu.

In one embodiment, the plasma gas can include one or more of $NH_3$ and $N_2$. Plasma gas can be ionized under certain conditions to react with CuO on the surface of the metal layer 209 to chemically reduce CuO to produce Cu.

The parameters of the plasma treatment can include: plasma-forming gas(es) of $NH_3$ and/or $N_2$, with a gas flow rate of about 100 sccm to about 1000 sccm; a reactor pressure of about 1 Torr to about 20 Torr; a treatment power of about 100 W to about 1000 W; and a treatment time of about 10 seconds to about 120 seconds.

Figure 10:
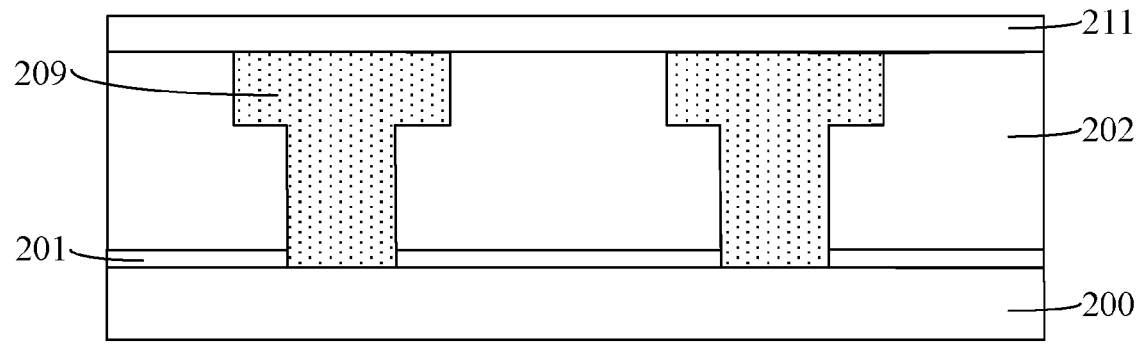

Returning to FIG. 1, after the plasma treatment is performed on the top surface of the metal layer, a semiconductor cover layer is formed over the dielectric layer and the metal layer (S109). FIG. 10 illustrates a corresponding cross-section view of the interconnect device.

As shown in FIG. 10, the semiconductor cover layer 211 may be formed over the dielectric layer 202 and the metal layer 209.

The semiconductor cover layer 211 may be made of Si and/or Ge. To reduce the difficulty of the fabrication process, the semiconductor cover layer 211 can be made of an amorphous material.

In one embodiment, the semiconductor cover layer 211 can cover the surface of the metal layer 209 and the surface of the dielectric layer 202. That is, the apex corner regions of the metal layer 209 can be fully covered by the semiconductor cover layer 211.

The semiconductor cover layer 211 can be used to prevent the copper atoms in the apex corner regions of the metal layer 209 from diffusing into undesired regions. For example, the semiconductor cover layer 211 can first provide a base for the subsequent formation of a metal capping layer on the metal layer 209. Because the semiconductor cover layer 211 may be formed on the surface of the dielectric layer 202 and the surface of the metal layer 209 simultaneously, no voids can be formed in the semiconductor cover layer 211. The semiconductor cover layer 211 can well cover the apex corner regions of the metal layer 209 to prevent the copper atoms in the apex corner regions of the metal layer 209 from diffusing into undesired regions.

The semiconductor cover layer 211 can be formed by using an atomic layer deposition, a low pressure chemical vapor deposition, and/or a plasma enhanced chemical vapor deposition.

In one embodiment, the thickness of the semiconductor cover 211 is preferably about 10 Å to about 50 Å.

In one embodiment, the semiconductor cover layer 211 can be made of Si. The fabrication parameter of the atomic layer deposition to form the semiconductor cover layer 211 can include: reactant gases including silicon source gases of $SiH_4$ or $SiH_2Cl_2$, with a flow rate of about 10 sccm to about 1000 sccm; a deposition temperature of about 250 degrees Celsius to about 400 degrees Celsius; and a reactor pressure of about 1 mTorr to about 50 Torr.

The semiconductor cover layer 211 formed by the atomic layer deposition process can have sufficiently high density to provide a desirable fabrication base for the subsequent formation of the metal capping layer. It is preferred that the metal capping layer can have desirably high density. Further, since the semiconductor cover layer 211 may have desirably high density, the subsequently-formed metal nitride layer and the semiconductor nitride layer may also have sufficiently high density. The metal nitride layer and the semiconductor nitride layer may effectively prevent the copper atoms from diffusing into undesired regions.

Figure 11:
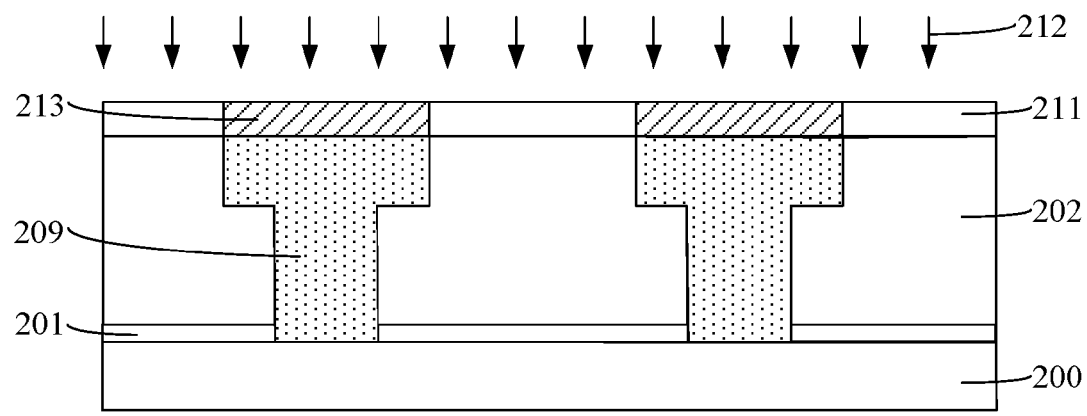

Returning to FIG. 1, after the semiconductor cover layer is formed over the metal layer and the dielectric layer, a thermal annealing reaction is performed on the semiconductor cover layer to covert portions of the semiconductor cover layer into a metal capping layer (S110). FIG. 11 illustrates a corresponding cross-section view of the interconnect device.

As shown in FIG. 11, a thermal annealing reaction 212 can be performed on the semiconductor cover layer 211 to convert the portions of the semiconductor cover layer 211 that are on top of the metal layer 209 into a metal capping layer 213.

The metal capping layer 213 may be made by a reaction between a metal material in the metal layer 209 and a semiconductor material in the semiconductor cover layer 211 during the annealing reaction 212. Such reaction may include a chemical reaction and/or a physical reaction. In an embodiment when the metal layer 209 is made of copper and the semiconductor cover layer 211 is made of Si, the metal capping layer 213 can be made of CuSi. In another embodiment, when the semiconductor cover layer 211 is made of Ge, the metal capping layer 213 can be made of CuGe.

The parameters of the thermal annealing reaction can include, for example, a thermal annealing temperature of about 300 degrees Celsius to about 400 degrees Celsius; and a thermal annealing time length of about 5 seconds to 300 seconds.

Since copper may have high diffusion rate in Si and silicon oxides, copper atoms in the metal layer 209 can easily diffuse into the dielectric layer connecting the top surface of the interconnect device. Copper diffusion can cause interconnect device to have degraded resistance to electromigration. In one embodiment, the metal capping layer 213 can be formed on the metal layer 209 to effectively prevent copper from diffusing into undesired regions. The metal capping layer 213 can enable copper to have reduced ability to diffuse into undesired regions. Also, metal capping layer 213 can prevent oxygen from diffusing into the interconnect device and reacting with copper in the interconnect device to result in degraded reliability of the interconnect device.

Further, since the semiconductor cover layer 211 can be formed to cover the surface of the metal layer 209 and the surface of the dielectric layer 202, the metal capping layer 213 formed on the metal layer 209 can have substantially the same surface dimensions as the metal layer 209 such that copper diffusion from the top surface of the metal layer 209 can be prevented. Further, since the metal capping layer 213 can be formed by converting the semiconductor cover layer 211 above the metal layer 209, the remaining semiconductor cover layer 211 and the metal capping layer 213 can share sidewalls (i.e., the semiconductor cover layer 211 and the metal capping layer 213 can be in direct contact in interface regions). That is, no voids can be formed in the interface between the semiconductor cover layer 211 and the metal capping layer 213. Thus, copper diffusion from the apex corner regions of the metal layer 209 can be effectively prevented. Further, copper diffusion from inside the metal layer 209 can also be prevented. Therefore, the interconnect device can have improved resistance to electromigration. Contact between the oxygen/moisture from outside environment and the metal layer can be prevented/reduced.

When the semiconductor cover layer 211 is made of Ge, the metal capping layer 213 formed from the semiconductor cover layer 211 can be made of CuGe. The chemical bond between Cu and Ge is sufficiently strong such that Ge diffusion rate can be low. Thus, by using CuGe as the material of the metal capping layer 213, diffusion of Ge atoms into the interconnect device can be reduced. The resistivity of the interconnect device can be reduced and the reliability of the interconnect device can be improved. Meanwhile, the desirably low resistivity of CuGe (about 6 Ω/cm) can reduce the RC delay of the interconnect device.

Figure 12:
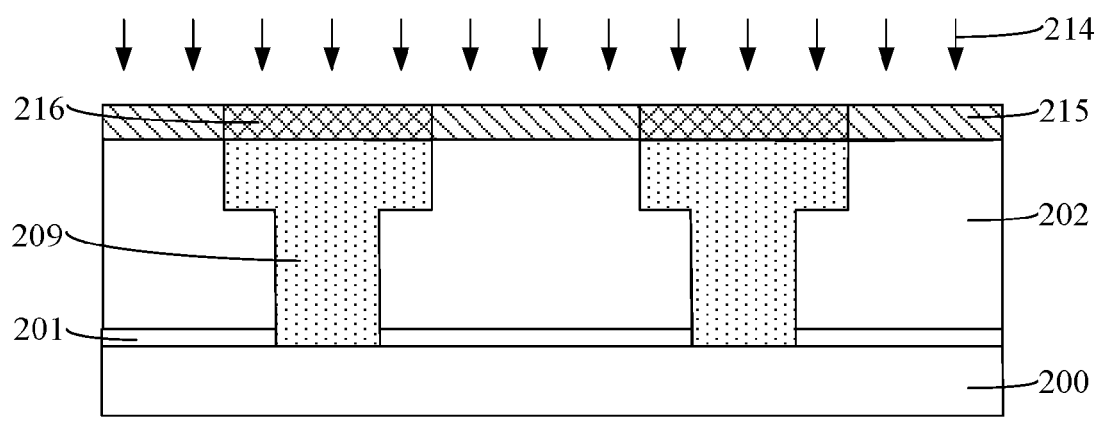

Returning to FIG. 1, after the thermal annealing reaction is performed on the semiconductor cover layer to convert the portions of the semiconductor cover layer on the metal layer to the metal capping layer, a nitridation process is performed on the metal capping layer and the remaining semiconductor cover layer to convert the metal capping layer into a metal nitride capping layer, and to convert the semiconductor cover layer into a semiconductor nitride layer (S111). FIG. 12 illustrates a corresponding cross-section view of the interconnect device.

As shown in FIG. 12, the nitridation process 214 can be performed on the metal capping layer 213 and the remaining semiconductor cover layer 211 to convert the metal capping layer 213 into a metal nitride capping layer 216, and to convert the semiconductor cover layer 211 into a semiconductor nitride layer 215.

The nitridation process 214 can further reduce the resistivity of the metal capping layer 213 and further improve the reliability of the metal capping layer 213. The nitridation process can also reduce the diffusion of the atoms from the semiconductor cover layer 211 to the dielectric layer 202. Thus, the reliability of the interconnect device can be improved.

In an embodiment, the semiconductor cover layer 211 can be made of Si. The metal capping layer 213 can be made of CuSi, the metal nitride capping layer 216 can be made of CuSiN, and the semiconductor nitride layer 215 can be made of $Si_3N_4$. The advantages of the nitridation process 214 can be described below.

First, the nitridation process can prevent Si atoms in the CuSi from diffusing into undesired regions. Since a CuSi atom is not stable, the Si atom can escape from the Cu—Si bond and diffuse into the metal layer 209 or the dielectric layer 202, and further cause the linear resistance of the interconnect device to increase. The reliability of the interconnect device can decrease accordingly. However, a Si—N bond is stronger than a Si—Cu bond (a N atom is smaller than a Cu atom, and a smaller atom may represent a stronger chemical bond), and Cu—Si—N bond can be formed in the CuSiN after the CuSi is completely converted into CuSiN. The Cu—Si—N bond can provide binding force over the Si atom, and it is therefore more difficult for Si atoms to escape from CuSiN to undesired regions. Thus, the interconnect device can have reduced resistivity.

Further, the nitridation process can prevent free Si atoms from diffusing into undesired regions. For example, the semiconductor cover layer 211 can be made of Si, and Si has a sufficiently high diffusion rate. After the nitridation process 211, free Si atoms in the semiconductor cover layer 211 can form Si—N bonds and be converted into semiconductor nitride 215. Diffusion of free Si atoms to undesired regions can thus be prevented.

Further, since the resistivity of CuSiN can be lower than the resistivity of CuSi, the resistivity of the interconnect device can be reduced after the nitridation process 214.

In another embodiment, the semiconductor cover layer 211 can be made of Ge. The metal capping layer 213 can be made of CuGe, the metal nitride capping layer 216 can be made of CuGeN; and the semiconductor nitride layer 215 can be made of $Ge_3N_4$. The advantages of the nitridation process 214 can be described below.

First, after the nitridation process 214, can the metal capping layer 213, made of CuGe, can be converted into a metal nitride capping layer 216. The metal nitride capping layer 216 may be made of CuGeN. CuGeN has a lower resistivity than CuGe, so the resistivity of the interconnect device can be further reduced. Also, since the chemical bond of Cu—Ge—N is stronger than the chemical bond of Cu—Ge, the Cu—Ge—N bond can provide stronger binding force over Ge and thus further prevent Ge atoms from diffusing into the dielectric layer 202.

Meanwhile, after the nitridation process 214, the semiconductor cover layer 211 can be converted into a semiconductor nitride layer 215. The semiconductor nitride layer 215 can be made of $Ge_3N_4$. The Ge—N chemical bond can provide stronger binding force over the Ge atom. Diffusion of Ge atoms into the dielectric layer 202 can be further prevented.

The reactant gas of the nitridation process 214 can be $NH_3$. The reactant gas may also include $N_2$.

In one embodiment, the parameters of the nitridation process 214 can include: reactant gases of $NH_3$ and $N_2$; an RF power of about 100 W to about 1000 W; and a nitridation process time length of about 5 seconds to about 300 seconds. The flow rate of the reactant gases, e.g., $NH_3$ and $N_2$, can be about 100 sccm to about 1000 sccm.

Since the metal capping layer 213 and the semiconductor cover layer 211 can be in direct contact and can share sidewalls, the metal nitride capping layer 216 can be in direct contact with the semiconductor nitride layer 215 after the nitridation process 214. The interface between the metal nitride capping layer 216 and the semiconductor nitride layer 215 may have no voids. Diffusion of copper atoms from the apex corner regions of the metal layer 209 to undesired regions can be prevented. The interconnect device may have improved resistance to electromigration and improved reliability.

Meanwhile, the exemplary CuSiN and/or CuGeN may have sufficiently strong adhesion to the copper atoms in the metal layer 209. The metal nitride capping layer 216 can provide desired interfacial condition for the subsequently-formed dielectric capping layer to further prevent diffusion of copper atoms from interconnect device to undesired regions.

Figure 13:
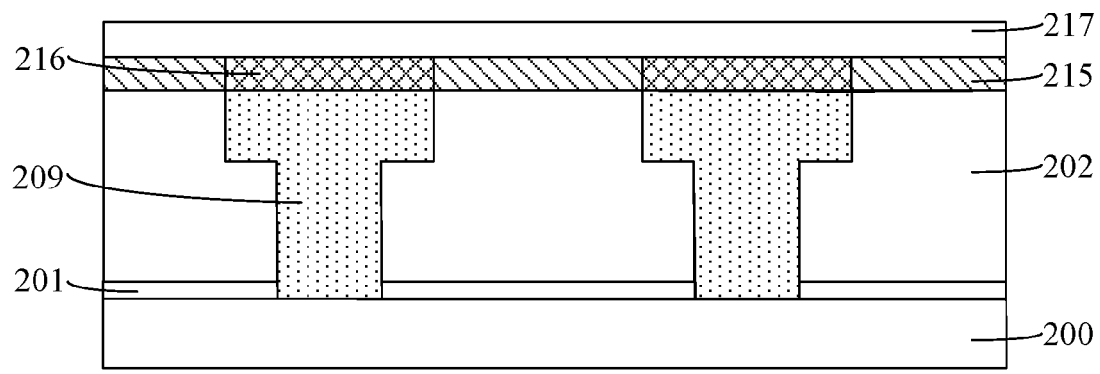

Returning to FIG. 1, after the nitridation process is performed to form the metal nitride capping layer and the semiconductor nitride layer, a dielectric capping layer is formed over the metal nitride capping layer and the semiconductor nitride layer (S112). FIG. 13 illustrates a corresponding cross-section view of the interconnect device.

As shown in FIG. 13, the dielectric capping layer 217 can be formed on the metal nitride capping layer 216 and the semiconductor nitride layer 215.

In another embodiment, no nitridation process 214 may be performed on the interconnect device. The dielectric capping layer 217 can be formed on the metal capping layer 213 and the semiconductor cover layer 211 as shown in FIG. 11.

The dielectric capping layer 217 can further prevent copper atoms in the metal layer 209 of the interconnect device from diffusing into undesired regions. The dielectric layer 217 can also further prevent oxygen from diffusing into the metal layer 209. Also, desirable interfacial condition may be provided between the dielectric capping layer 217 and the metal nitride capping layer 216, and between the dielectric capping layer 217 and the semiconductor nitride layer 215 such that diffusion of copper atoms and oxygen can be further prevented.

The dielectric capping layer 217 can be made of one or more of SiCN, $Si_3N_4$, and SiC. The dielectric capping layer 217 can be a single-layered structure or a multiple-layered structure.

The dielectric capping layer 217 can be formed through a chemical vapor deposition process, a physical vapor deposition process, and/or an atomic layer deposition process.

In one embodiment, the dielectric capping layer 217 can be made of SiCN and formed through a plasma chemical vapor deposition process. The reactant gases can include trimethylsilane and/or tetramethylsilane. The reactant gases can also include $NH_3$. The deposition process can be performed in an inert gas He ambient.

The parameters of the plasma chemical vapor deposition process may include: reactant gases of 3MS and/or 4MS having a flow rate of about 200 sccm to about 5000 sccm; $NH_3$ having a flow rate of about 200 sccm to about 5000 sccm; He having a flow rate of about 500 sccm to about 10000 sccm; a high-frequency RF deposition power of about 300 W to about 3000 W; a low-frequency RF deposition power of about 0 W to about 1000 W; a reactor pressure of about 1 mTorr to about 100 Torr; and a reactor temperature of about 200 degrees Celsius to about 450 degrees Celsius.

In one embodiment, the thickness of the dielectric capping layer 217 can be about 50 Å to about 500 Å.

To summarize, the method disclosed for forming interconnect device have the following advantages.

First, the semiconductor cover layer can well cover the surface of the metal layer, the surface of the dielectric layer, and the apex corner regions of the metal region to prevent voids from being formed in semiconductor cover layer and/or near the apex corner regions of the metal layer. After performing the thermal annealing reaction on the semiconductor cover layer, the portions of semiconductor cover layer on the metal layer can be converted into a metal capping layer. The metal capping layer can provide a desirable barrier for preventing metal atoms from diffusing into undesired regions. Also, since the metal capping layer is converted from portions of the semiconductor cover layer on the metal layer, the interfaces between the metal capping layer and the remaining semiconductor cover layer can have sufficiently desirable interfacial condition. The metal capping layer and the remaining semiconductor cover layer can be in direct contact and can share sidewalls such that no voids can be formed at the interface. Thus, the diffusion of the metal atoms in the apex corner region of the metal layer close to the interface can be well suppressed, and the interconnect device can have improved resistance to electromigration. The electrical properties of the interconnect device can be improved.

Further, the metal capping layer can be converted into the metal nitride layer to improve the chemical binding force over Si and/or Ge in the metal capping layer such that diffusion of Si atoms and/or Ge atoms into undesired regions can be prevented. Adverse effect on the resistivity of interconnect device can be prevented. Also, after the nitridation process, the resistivity of the formed metal nitride layer can be lower than the resistivity of the metal capping layer. Thus, RC delay of the interconnect device can be effectively reduced.

Further, performing the nitridation process on the remaining semiconductor cover layer can covert free Si atoms and/or free Ge atoms in the semiconductor cover layer into $Si_3N_4$ or $Ge_3N_4$ to prevent free Si atoms and/or free Ge atoms from diffusing into undesired regions. The resistivity and the RC delay of the interconnect device can be further reduced. Also, the semiconductor nitride layer can provide a more desirable barrier to prevent copper atoms from diffusing into undesired regions. Thus, the interconnect device can have improved resistance to electromigration.

Further, the dielectric capping layer can be formed on the metal nitride capping layer and the semiconductor nitride layer to further prevent the metal atoms (e.g., copper atoms) from diffusing into undesired regions. The dielectric capping layer can also prevent oxygen and/or moisture in the environment from contacting the metal layer to cause erosion/oxidation. The electrical properties of the interconnect device can be further improved.

Furthermore, the metal capping layer can be made of CuGe (i.e., having a resistivity of 6 Ω/cm). Compared to CuSi (i.e., having a resistivity of 50 Ω/cm) and CuSiN, CuGe has a lower resistivity. In this case, lower resistivity can reduce the RC delay of the interconnect device.

As shown in FIG. 11, the present disclosure also provides an interconnect device. The interconnect device may include a substrate 200, a metal capping layer 216, and a semiconductor cover layer 215.

A dielectric layer 202 may be formed on the substrate. Damascus openings (e.g., dual Damascus opening) may be formed in the dielectric layer 202 and a metal layer 209 may be formed to fill up the Damascus openings.

A metal capping layer 216 may be formed on the metal layer 209. A semiconductor cover layer 215 may be formed on the dielectric layer 202. The semiconductor cover layer 215 and the metal capping layer 216 may be in contact and share sidewalls.

Specifically, the substrate 200 can be made of Si, Ge, SiGe, and/or GaAs. The dielectric layer 202 can be made of $SiO_2$, a low k dielectric material, and/or an ultra-low k dielectric material. An etch-stop layer 201 can be formed between the substrate 200 and the dielectric layer 202.

The metal layer 209 can be single-layered or multiple-layered. When the metal layer 209 is single-layered, the metal layer can be made of a metal bulk layer filling up the opening. When the metal layer 209 is multiple-layered, the metal layer can include a barrier layer covering the sidewall and the bottom of each opening, a metal seed layer on the barrier layer, and a metal bulk layer filling up the opening.

For illustration purposes, the metal layer 209 in the present disclosure is single-layered. The metal layer 209 can be made of Cu. The top surface of the metal layer 209 can be coplanar with the top surface of the dielectric layer 202.

The semiconductor cover layer 215 and the metal capping layer 216 can both prevent copper atoms in the metal layer 209 from diffusing into undesired regions.

In an embodiment, the semiconductor cover layer 215 can be made of Si, and the metal capping layer 216 can be made of CuSi. In another embodiment, the semiconductor cover layer 215 can be made of Ge, and the metal capping layer 216 can be made of CuGe.

In an embodiment, the metal capping layer 216 can be a metal nitride layer and the metal nitride layer can be made of CuSiN. The semiconductor cover layer 215 can be a semiconductor nitride layer and the semiconductor nitride layer can be made of $Si_3N_4$. In another embodiment, the metal capping layer 216 can be a metal nitride layer and the metal nitride layer can be made of CuGeN. The semiconductor cover layer 215 can be a semiconductor nitride layer and the semiconductor nitride layer can be made of $Ge_3N_4$.

The semiconductor cover layer 215 and the metal capping layer 216 can both prevent copper atoms in the metal layer 209 from diffusing into undesired regions. The interface between the semiconductor cover layer 215 and the metal capping layer 216 can be in the apex corner regions of the metal layer 209. The semiconductor cover 215 and the metal capping layer 216 be in direct contact and share the sidewalls to effectively prevent diffusion of copper atoms from the apex corner regions of the metal layer 209. The interconnect device can have improved resistance to electromigration.

The semiconductor cover layer 215 and the metal capping layer 216 can also prevent outside oxygen and/or moisture from contacting the metal layer 209 to prevent erosion/oxidation of the copper atoms in the metal layer 209.

When the metal capping layer 216 is made of CuSiN (i.e., the metal capping layer 216 is a metal nitride layer, and the metal nitride layer is made of CuSiN), it may be difficult for Si atoms to escape from CuSiN to diffuse into undesired regions, and the interconnect device can have desirably low resistivity and reduced RC delay. Also, the desirably low resistivity of the CuSiN can reduce the RC delay of the interconnect device. When the semiconductor cover layer 215 is made of $Si_3N_4$ (i.e., the semiconductor cover layer 215 is a semiconductor nitride layer, and the semiconductor nitride layer is made of $Si_3N_4$), it may be difficult for Si atoms to escape from $Si_3N_4$, and the RC delay of the interconnect device can be further reduced.

When the metal capping layer 216 is made of CuGeN (i.e., the metal capping layer 216 is a metal nitride layer, and the metal nitride layer is made of CuGeN), because CuGeN has lower resistivity compared to CuSiN, the RC delay of the interconnect device can be further reduced. In addition, Ge has a lower diffusion rate than Si, diffusion of Ge atoms into undesired regions can be further prevented. The electrical properties of the interconnect device can be improved.

The interconnect device can further include the dielectric capping layer 217 on the semiconductor cover layer 215 and the metal capping layer 216.

The dielectric capping layer 217 can further prevent copper atoms in the metal layer 209 from diffusing into undesired regions. Meanwhile, the dielectric layer 217 can further prevent outside oxygen and/or moisture from contacting the metal layer 209 to cause erosion/oxidization of the copper atoms. The dielectric capping layer 217 can be made of one or more of SiCN, $Si_3N_4$, and SiC. Compared with conventional interconnect device, the disclosed fabrication method has the following advantages.

In the disclosed embodiments, after forming the metal layer, the semiconductor cover layer can be formed on the metal layer and the dielectric layer in the same fabrication step. The semiconductor cover layer can fully cover the surface of the metal layer and the surface of the dielectric layer well. The semiconductor cover layer can also fully cover the apex corner regions of the metal layer to prevent voids from being formed in the semiconductor cover layer near the apex corner regions of the metal layer. Further, in the thermal annealing reaction, portions of the semiconductor cover layer on the metal layer can react with an underlying portion of the metal layer to convert a corresponding portion of the semiconductor cover layer into a metal capping layer. The metal capping layer has desirable resistance to diffusion of metal atoms (e.g., copper atoms). Also, because the metal capping layer is converted from the semiconductor cover layer on the metal layer, desirable interfacial condition can be formed between the metal capping layer and the remaining semiconductor cover layer. The metal capping layer and the remaining semiconductor cover layer are in direct contact and share sidewalls to prevent voids from being formed in the interfaces between the remaining semiconductor cover layer and metal capping layer. Therefore, the diffusion of metal atoms in the apex corner regions of the metal layer are desirably suppressed, and the interconnect device can have improved resistance to electromigration. The electrical properties of the interconnect device can be optimized/improved.

Further, the nitridation process performed on the metal capping layer can convert the metal capping layer to a metal nitride layer and enhance the binding force of chemical bond Si and/or Ge to prevent Si atoms and/or Ge atoms from escaping from the metal capping layer to undesired regions. Adverse effect to the resistivity of the interconnect device can be prevented. Also, after performing the nitridation process of the metal capping layer, the material of the formed metal nitride layer can have a resistivity lower than the material of the metal capping layer, and the RC delay of the interconnect device can be effectively reduced.

Further, the nitridation process performed on the remaining semiconductor cover layer can convert free Si atoms or free Ge atoms in the semiconductor cover layer into $Si_3N_4$ or $Ge_3N_4$ and prevent free Si atoms or Ge atoms from diffusing into undesired regions. Meanwhile, $Si_3N_4$ has a lower resistivity than Si and $Ge_3N_4$ has a lower resistivity than Ge, so the resistivity of the interconnect device and the RC delay of the interconnect device can be further reduced. Also, the semiconductor nitride layer can provide a more desirable barrier to prevent the copper atoms from diffusing into undesired regions. The interconnect device can have an improved resistance to electromigration.

Further, the metal capping layer can be made of CuGe (i.e., having a resistivity of 6 Ω/cm). Compared to CuSi (i.e., having a resistivity of 50 Ω/cm) and CuSiN, the resistivity of CuGe is much lower. In this case, lower resistivity can reduce the RC delay of the interconnect device.

Further, in the embodiments of the present disclosure, an atomic layer deposition process is used to form the semiconductor cover layer. The atomic layer deposition process has a desirably low reaction temperature (about 250 degrees Celsius to about 400 degrees Celsius) to avoid increased diffusion of copper atoms at a higher temperature. Also, the atomic layer deposition can form semiconductor cover layer with desirable density such that the metal nitride capping layer and the semiconductor nitride layer formed based on the semiconductor cover layer can have desirably high density to improve the barrier for diffusion of copper atoms. The interconnect device can thus have improved resistance to electromigration.

Embodiments of the present disclosure further provides an interconnect device with improved structures and properties. The interconnect device includes a metal capping layer on the metal layer and a semiconductor cover layer on the dielectric layer. The metal capping layer and the semiconductor cover layer can both prevent metal atoms in the metal layer from diffusing into undesired regions. Also, the metal capping layer and the semiconductor cover layer are in direct contact and share sidewalls, so that the interface between the metal capping layer and the semiconductor cover layer can at least partially prevent metal atoms from the apex corner regions of the metal layer from diffusing into undesired regions. Thus, the interconnect device can have desirably high resistance to electromigration.

Furthermore, the metal capping layer can be a metal nitride layer, and the metal nitride layer can be made of CuSiN. Since it may be difficult for Si atoms to escape from CuSiN, the Si atoms in the metal capping layer can be prevented from diffusing into undesired regions. Thus, the interconnect device can have a desirably low resistivity and a reduced RC delay. In addition, the CuSiN can have a desirably low resistivity to reduce the RC delay of the interconnect device. When the semiconductor cover layer is a semiconductor nitride layer, the semiconductor nitride layer can be made of $Si_3N_4$. It may be difficult for Si atoms to escape from $Si_3N_4$, so the RC delay of the interconnect device can be further reduced.

Moreover, the metal capping layer can be a metal nitride layer, and the metal nitride layer can be made of CuGeN. Compared to CuSiN, CuGeN has lower resistivity and can further reduce the RC delay of the interconnect device. In addition, the diffusion rate of Ge is lower than the diffusion rate of Si. Thus, diffusion of Ge atoms into undesirable regions can be further prevented. Electrical properties of the interconnect device can be improved.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for forming an interconnect device, comprising:
    providing a dielectric layer on a substrate;
    forming openings in the dielectric layer to expose a portion of a surface of the substrate at a bottom of each opening;
    forming a metal layer to fill up the openings;
    forming a semiconductor cover layer on the metal layer and on the dielectric layer;
    performing a thermal annealing reaction on the semiconductor cover layer to convert portions of the semiconductor cover layer that are on the metal layer into a metal capping layer; and
    performing a nitridation process on the metal capping layer and a remaining semiconductor cover layer to convert the metal capping layer into a metal nitride capping layer and the remaining semiconductor cover layer into a semiconductor nitride layer.

2. The method according to claim 1, wherein the metal layer is made of Cu.

3. The method according to claim 2, further including a plasma treatment to remove oxidized Cu after a chemical mechanical polishing process on the metal layer and before forming the semiconductor cover layer, wherein the plasma treatment uses plasma-forming gases including $NH_3$ and $N_2$.

4. The method according to claim 1, wherein the semiconductor cover layer is made of amorphous silicon and formed by an atomic layer deposition, and has a thickness of about 10 Å to about 50 Å.

5. The method according to claim 1, wherein parameters of the thermal annealing reaction for forming the metal capping layer include:
    a thermal annealing temperature of about 300 degrees Celsius to about 400 degrees Celsius; and a thermal annealing time length of about 5 seconds to about 300 seconds.

6. The method according to claim 1, wherein the metal nitride capping layer includes a CuSiN layer and the semiconductor nitride layer includes a $Si_3N_4$ layer converted from an amorphous silicon layer.

7. The method according to claim 1, wherein the dielectric capping layer is formed by a chemical vapor deposition process, a physical vapor deposition process, an atomic layer deposition process, or a combination thereof.

8. The method according to claim 1, wherein the semiconductor cover layer is made of Si, Ge, or a combination of Si and Ge.

9. The method according to claim 1, wherein the semiconductor cover layer is made of an amorphous material.

10. The method according to claim 8, wherein the semiconductor cover layer is formed by an atomic layer deposition process, a low pressure chemical vapor deposition process, a plasma-enhanced chemical vapor deposition process, or a combination thereof.

11. The method according to claim 10, wherein when the semiconductor cover layer is made of Si, parameters of the atomic layer deposition process include: reactant gases including a silicon source gas of $SiH_4$ or $SiH_2Cl_2$ with a flow rate of about 10 sccm to about 1000 sccm; a deposition temperature of about 250 degrees Celsius to about 400 degrees Celsius; and a reactor pressure of about 1 mTorr to about 50 Torr.

12. The method according to claim 1, wherein the metal capping layer is made of CuSi or CuGe.

13. The method according to claim 1, wherein parameters of the nitridation process include: reactant gases of $NH_3$ and $N_2$ having a flow rate of about 100 sccm to about 1000 sccm; an RF power of about 100 W to about 1000 W; and a nitridation process time length of about 5 seconds to about 300 seconds.

14. The method according to claim 1, wherein the metal nitride capping layer is made of CuGeN, and the semiconductor nitride layer is made of $Ge_3N_4$.

15. The method according to claim 1, wherein a dielectric capping layer is further formed on the metal nitride capping layer and on the semiconductor nitride layer.

16. The method according to claim 1, wherein the dielectric capping layer is made of one or more of SiCN, $Si_3N_4$, and SiC.

17. The method according to claim 3, wherein parameters of the plasma treatment include: a plasma-forming gas including at least one of $NH_3$ and $N_2$ having a gas flow rate of about 100 sccm to about 1000 sccm; a reactor pressure of about 1 Torr to about 20 Torr; a treatment power of about 100 W to about 1000 W; and a treatment time length of about 10 seconds to about 120 seconds.

* * * * *